(12) United States Patent
Penny et al.

(10) Patent No.: US 10,763,160 B1
(45) Date of Patent: Sep. 1, 2020

(54) SEMICONDUCTOR DEVICE WITH SELECTIVE INSULATOR FOR IMPROVED CAPACITANCE

(71) Applicant: International Business Machines Corporation, Armonk, NY (US)

(72) Inventors: Christopher J. Penny, Saratoga Springs, NY (US); Benjamin D. Briggs, Waterford, NY (US); Michael Rizzolo, Delmar, NY (US); Lawrence A. Clevenger, Saratoga Springs, NY (US); Huai Huang, Saratoga, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/362,034

(22) Filed: Mar. 22, 2019

(51) Int. Cl.
*H01L 21/768* (2006.01)
*H01L 23/522* (2006.01)
*H01L 23/532* (2006.01)
*H01L 21/311* (2006.01)

(52) U.S. Cl.
CPC .... *H01L 21/7682* (2013.01); *H01L 21/31144* (2013.01); *H01L 21/76816* (2013.01); *H01L 21/76877* (2013.01); *H01L 23/5226* (2013.01); *H01L 23/5329* (2013.01)

(58) Field of Classification Search
None
See application file for complete search history.

(56) References Cited

U.S. PATENT DOCUMENTS

| | | | |
|---|---|---|---|
| 6,994,949 B2 | 2/2006 | Lee et al. | |
| 9,099,465 B2 | 8/2015 | Zhang | |
| 9,576,893 B2 | 2/2017 | Huang et al. | |
| 9,666,451 B2 | 5/2017 | Wallace et al. | |
| 9,837,355 B2 | 12/2017 | Briggs et al. | |
| 9,875,967 B2 | 1/2018 | Yang et al. | |
| 9,929,088 B2 | 3/2018 | Briggs et al. | |
| 2003/0003404 A1 | 1/2003 | Lee et al. | |
| 2009/0093100 A1 | 4/2009 | Xia et al. | |
| 2010/0133699 A1 | 6/2010 | Werner et al. | |
| 2015/0102496 A1 | 4/2015 | Zhang | |
| 2015/0137376 A1 | 5/2015 | Huang et al. | |
| 2016/0204002 A1 | 7/2016 | Wallace et al. | |
| 2017/0194259 A1 | 7/2017 | Yang et al. | |
| 2017/0278796 A1 | 9/2017 | Briggs et al. | |
| 2017/0301621 A1* | 10/2017 | Briggs | H01L 21/7682 |

FOREIGN PATENT DOCUMENTS

WO 2018125111 A1 7/2018

* cited by examiner

*Primary Examiner* — Herve-Louis Y Assouman
(74) *Attorney, Agent, or Firm* — Vazken Alexanian; Ryan, Mason & Lewis, LLP

(57) ABSTRACT

Techniques are provided to fabricate semiconductor devices. For example, a semiconductor device can include an alternating arrangement of vertical metallic lines defining openings therebetween on a substrate. An interlevel dielectric layer is disposed on a consecutive first opening and a second opening to seal an air gap between a top surface of the substrate and a bottom surface of the interlevel dielectric layer.

17 Claims, 19 Drawing Sheets

100

100

200

200

SEMICONDUCTOR DEVICE WITH SELECTIVE INSULATOR FOR IMPROVED CAPACITANCE

BACKGROUND

The fabrication of a very-large scale integrated (VLSI) circuit requires an interconnect structure including metallic wiring that connects individual devices in a single semiconductor chip. With the chip being massively reduced in size over the years, the interconnect structure has also been reduced accordingly. The via levels are one of the most challenging to print. Additionally, there are overlay errors that result from misalignment during the lithography process. The overlay errors may lead to reliability issues.

SUMMARY

Embodiments described herein provide methods of forming semiconductor devices with selective insulator for improved capacitance.

For example, one exemplary embodiment includes a method for forming a semiconductor device. The method comprises forming an alternating arrangement of vertical metallic lines and vertical dielectric spacers on a substrate. The method further comprises recessing the vertical dielectric spacers below a top surface of the vertical metallic lines. The method further comprises selectively depositing an interlevel dielectric layer on the recessed vertical dielectric spacers and above the top surface of the vertical metallic lines. The method further comprises depositing a dielectric fill on the interlevel dielectric layer and over the top surface of the vertical metallic lines. The method further comprises patterning a photoresist on the dielectric fill to form a plurality of openings in the photoresist. A first opening of the photoresist is in vertical alignment with a first vertical dielectric spacer and a second opening of the photoresist is in vertical alignment with a second vertical dielectric spacer. At least a third vertical dielectric spacer and a fourth vertical dielectric spacer are disposed between the first vertical dielectric spacer and the second vertical dielectric spacer. The method further comprises selectively etching the dielectric fill and the interlevel dielectric layer in the first opening and the second opening to expose a top surface of the respective first vertical dielectric spacer and the second vertical dielectric spacer. The method further comprises removing the photoresist and the dielectric fill. The method further comprises removing the vertical dielectric spacers to expose the top surfaces of the substrate in the first opening and the second opening and the vertical metallic lines. The first interlevel dielectric layer seals an air gap between a top surface of the substrate and a bottom surface of the interlevel dielectric layer in place of the third vertical dielectric spacer and the fourth vertical dielectric spacer.

Another exemplary embodiment includes a method for forming a semiconductor device. The method comprises forming an alternating arrangement of vertical metallic lines and vertical dielectric spacers on a substrate. The method further comprises recessing the vertical metallic lines below a top surface of the vertical dielectric spacers. The method further comprises selectively depositing an interlevel dielectric layer on the vertical dielectric spacers and on sidewalls in the recessed vertical metallic lines leaving an opening therebetween exposing a top service of the recessed vertical metallic lines. The method further comprises depositing a dielectric fill on the interlevel dielectric layer and in the openings. The method further comprises patterning a photoresist on the dielectric fill to form a plurality of openings in the photoresist. A first opening of the photoresist is in vertical alignment with a first vertical dielectric spacer and a second opening of the photoresist is in vertical alignment with a second vertical dielectric spacer. At least a third vertical dielectric spacer and a fourth vertical dielectric spacer are disposed between the first vertical dielectric spacer and the second vertical dielectric spacer. The method further comprises selectively etching the dielectric fill and the interlevel dielectric layer in the first opening and the second opening to expose a top surface of the respective first vertical dielectric spacer and the second vertical dielectric spacer. The method further comprises removing the photoresist. The method further comprises removing the vertical dielectric spacers to expose the top surfaces of the substrate in the first opening and the second opening and the vertical metallic lines. The interlevel dielectric layer seals an air gap between a top surface of the substrate and a bottom surface of the interlevel dielectric layer in place of the third vertical dielectric spacer and the fourth vertical dielectric spacer.

Another exemplary embodiment includes a semiconductor device which comprises a semiconductor device comprising an alternating arrangement of vertical metallic lines defining openings therebetween on a substrate. An interlevel dielectric layer is disposed on a consecutive first opening and a second opening to seal an air gap between a top surface of the substrate and a bottom surface of the interlevel dielectric layer.

These and other features, objects and advantages of the present invention will become apparent from the following detailed description of illustrative embodiments thereof, which is to be read in connection with the accompanying drawings.

DETAILED DESCRIPTION

Figure 1:
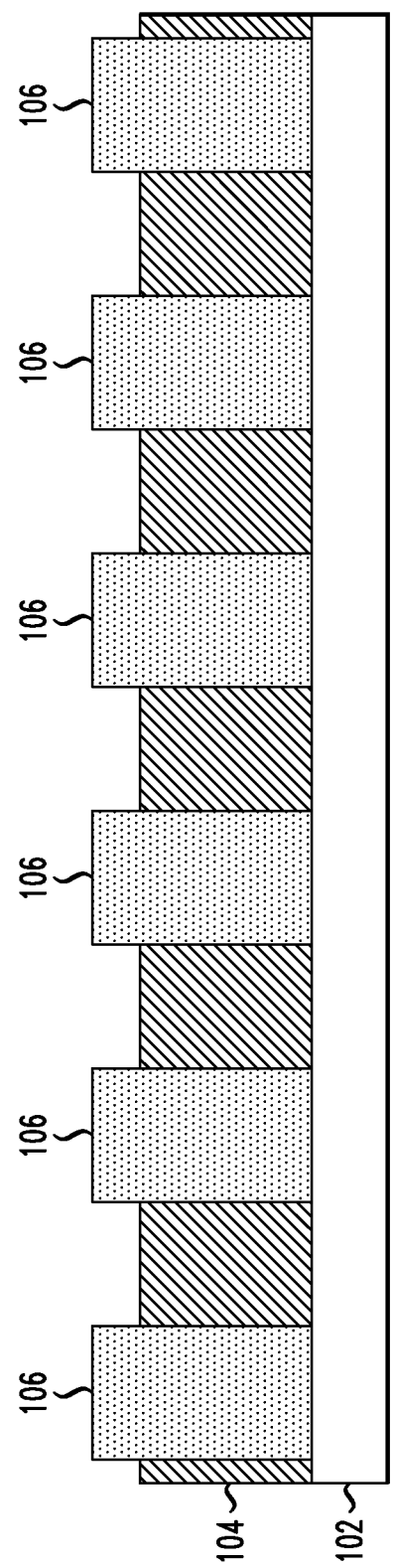
FIG. 1 is a cross-sectional view of a semiconductor device showing an interconnect structure with a recessed dielectric and a selective ILD deposition on a substrate, in accordance with one illustrative embodiment.

The present invention relates to semiconductor processing, and more particularly to semiconductor devices and methods for fabrication having an airgap protection layer for via placement and alignment. In accordance with the present principles, structures, devices and methods are provided that include a protection mechanism for airgap formation. Current integration schemes for airgap processing require that no gaps are formed around vias landing on a metal level that is gapped. In dense circuit structures, this restriction can significantly limit the area that is able to be gapped. In thin wire applications, the via density may be high enough (particularly in critical areas) to prevent airgap placement. Additionally, the use of a fully aligned via (FAV) is desired to achieve minimum insulator requirements. A FAV is when metal interconnects or vias are fully aligned to a first metallization level (M1) and a second metallization level (M2). Thus, fully aligned metal interconnects are referred to herein as FAVs. Integrating the airgap with a FAV does not presently include a way that maintains the FAV aspects while also achieving the airgap density required to realize the full performance benefit. Accordingly, there is a need to provide a technique of forming a fully aligned via while also achieving the airgap density required to realize the full performance benefit that is more efficient and avoids affecting yield and reliability issues such that there is an improvement in process margin and electromigration resistance.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It has been determined that an airgap spacer, such as the spacers formed around vias, are suitable for reducing device capacitance in semiconductor devices. An air gap spacer is a dielectric spacer that includes an enclosed void. As used herein, an "air gap" means a void that is not filled with solid material. It may be filled with a liquid and/or a gas such as air. Further details of the methods and structures of the present disclosure are now discussed with greater detail with reference to FIGS. 1-9 for a first embodiment, and to FIGS. 10-19 for a second embodiment.

Referring now to FIGS. 1-9 in which like numerals represent the same or similar elements and initially to FIG. 1, a cross-sectional view of a semiconductor structure 100 is illustratively shown for an interconnection level in accordance with the present principles. A substrate 102 may represent a previous metallization layer or may represent a substrate having semiconductor components (e.g., a transistor, etc.) formed therein. The substrate 102 may include any structure where repeating metallization structures are to be connected. For example, as one skilled in the art will understand, the substrate 102 may be a metal layer that is part of an interlevel dielectric (ILD) level referred to as a first ILD level and its metal level may be referred to as Mx (x=1, 2, 3, etc.). The immediate ILD level overlying the metal level Mx may be referred to as a second ILD level which includes metal level Mx+1 and the next overlying ILD level may be referred to as a third ILD level having metal level Mx+2, etc.

A vertical dielectric spacer 104 is formed on the substrate 102. The vertical dielectric spacer 104 may include any suitable dielectric material. In one embodiment, the dielectric spacer 104 may include an ultra-low dielectric constant (ULK) material or higher dielectric constant materials, such as, e.g., octamethylcyclotetrasiloxane (OMCTS), tetraethyl orthosilicate (TEOS), hydrogen silsesquioxane (HSQ), polyimide or porous versions of other dielectric materials (e.g., silicon oxides, etc.). A low-K dielectric is considered a material with a dielectric constant less than 3.9 (the dielectric constant of silicon dioxide), an ultra low-K dielectric refers to a dielectric constant much smaller than 3.9 and a high-K dielectric is a material with a dielectric constant greater than 3.9. The vertical dielectric spacer 104 may be formed by, for example, a spin-on process, chemical vapor deposition (CVD) or any other suitable process. A plasma-enhanced chemical vapor deposition (PECVD) may be employed for depositing silicon dioxide ($SiO_2$), fluorine-doped oxides (F—$SiO_2$), carbon-doped oxides (SiCOH) and porous carbon-doped oxides (p-SiCOH). PECVD materials including additional porosity (p-SiCOH) may be employed for back end of the line (BEOL) applications.

After the formation of the vertical dielectric spacer 104, a lithographic patterning process may be performed to pattern the vertical dielectric spacer 104 to form openings for the deposition of conductive materials. The conductive materials are deposited in the openings, and a planarization process, such as, e.g., a chemical mechanical polish (CMP) may be performed to form vertical metallic lines 106. The vertical metallic lines 106 may include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotubes, conductive carbon, graphene, or any suitable combination of these materials. The conductive material of the vertical metallic lines 106 may further comprise dopants that are incorporated during or after deposition. In one embodiment, the vertical metallic lines 106 include copper. As shown in FIG. 1, the substrate 102 includes an alternating arrangement of vertical metallic lines 106 and vertical dielectric spacer 104 on the substrate.

Figure 2:
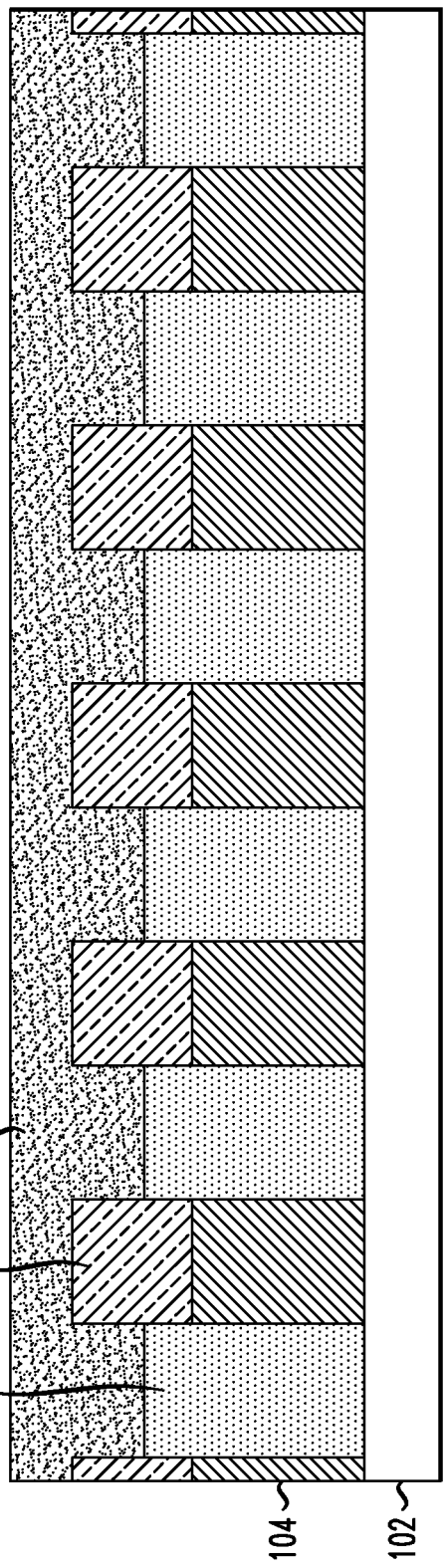
FIG. 2 is a cross-sectional view of a semiconductor device showing an interconnect structure with a dielectric fill/deposition, in accordance with one illustrative embodiment.

Referring to FIG. 2, following planarization of semiconductor structure 100, vertical dielectric spacer 104 is selectively recessed using techniques known in the art. For example, vertical dielectric spacers 104 can be selectively recessed using directional removal techniques such as, for example, reactive ion etching (ME).

Next, a selective ILD deposition 108 is carried out on semiconductor structure 100. Selective dielectric deposition methods may commonly include atomic layer deposition (ALD), CVD, and liquid phase deposition methods. The methods may utilize a specific catalytic activity of an active surface for purposes of selective deposition upon that surface.

Within the context of the instant embodiment for selectively depositing an ILD layer 108, e.g., a silicon oxide layer, selective ILD layer 108 includes, for example, silicon oxide, silicon nitride, silicon oxinitride, metal silicon nitride/oxide with the metal being Ta, Zr, Hf or W, silicon carbide, silicon carbo-oxide, and their hydrogenated compounds Following the selective dielectric deposition, a dielectric fill layer 110 is deposited on vertical metallic lines 106 and ILD layers 108. The dielectric fill layer 110 includes, for example, silicon dioxide, flowable oxide, spin-on-glass, etc. According to an embodiment of the present invention, the dielectric fill layer 110 is deposited using, for example, deposition techniques including, but not limited to, CVD, PECVD, ALD, radio-frequency enhanced chemical vapor deposition (RFCVD), and physical vapor deposition (PVD), followed by a planarization process, such as, for example, CMP.

Figure 3:
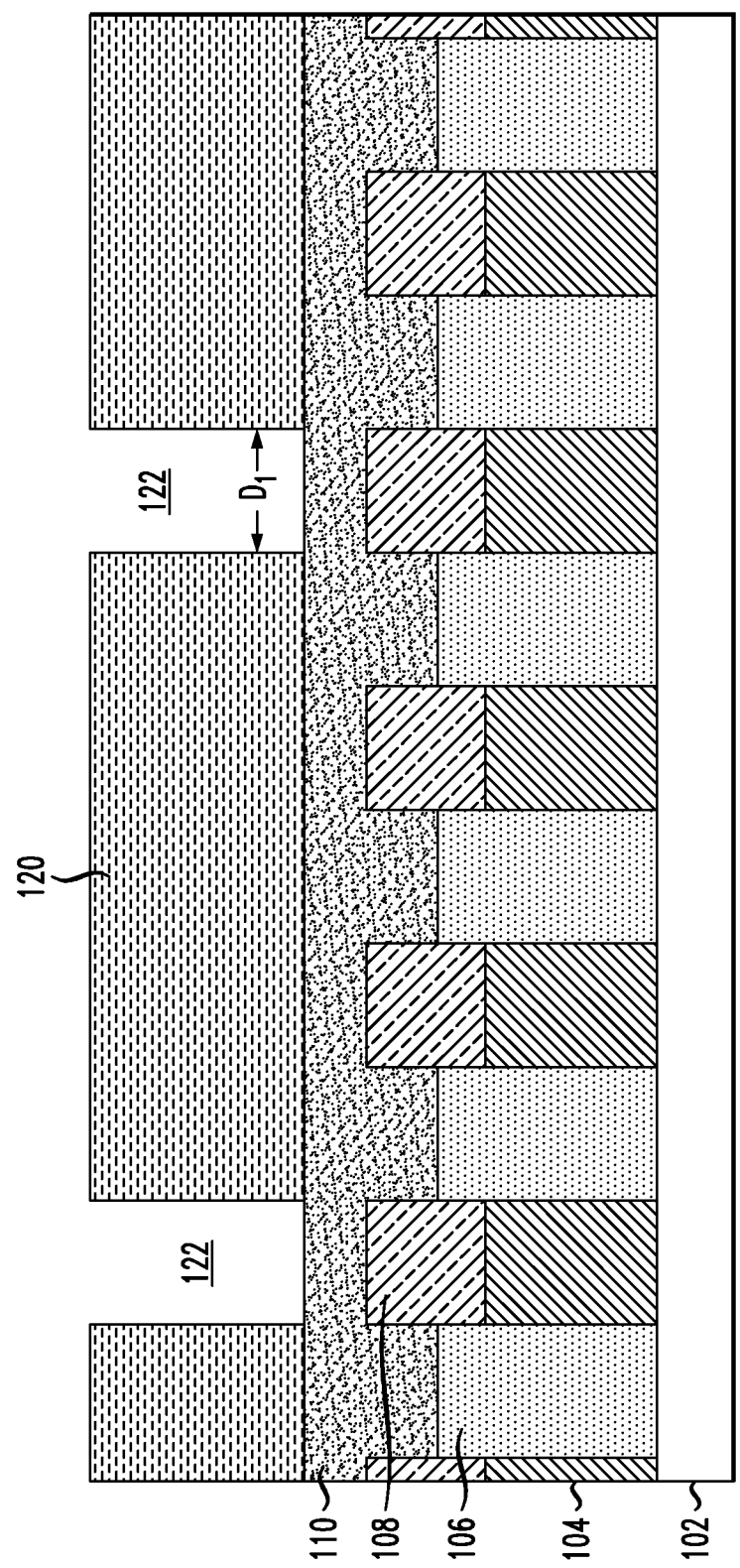
FIG. 3 is a cross-sectional view of a semiconductor device showing an interconnect structure with an airgap patterning, in accordance with one illustrative embodiment.

Referring to FIG. 3, a photoresist layer 120 is disposed on top of dielectric fill layer 110 to cover the semiconductor structure 100. The photoresist layer 120 is patterned/etched to create openings 122. The openings 122 may have a distance $D_1$ (e.g., a diameter or width in the x-axis) that is etched into the photoresist layer 122. In one implementation, the distance $D_1$ is a distance equal to the distance of ILD layers 108.

Figure 4:
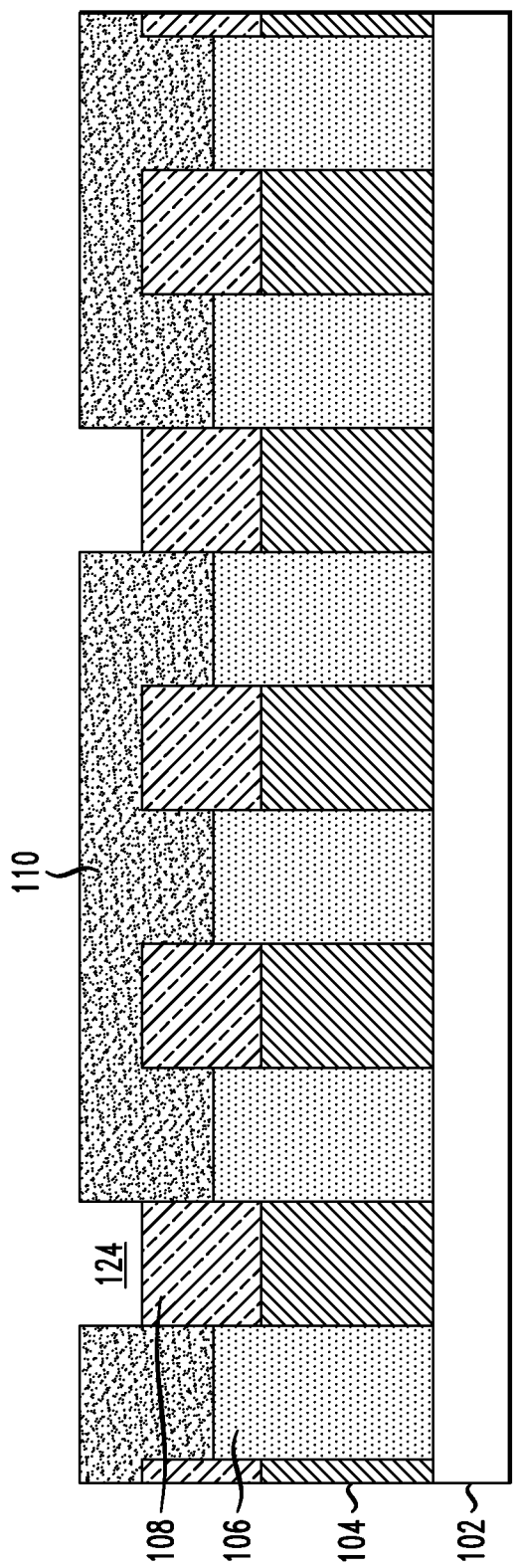
FIG. 4 is a cross-sectional view of a semiconductor device showing an interconnect structure following an airgap etch, in accordance with one illustrative embodiment.

Referring to FIG. 4, an airgap patterning etch is then performed on semiconductor structure 100 according to an embodiment. Etching is performed to extend openings 122 in the photoresist layer 120 as the pattern location (in FIG. 3). In the openings 122, the etching removes the dielectric fill layer 110 to expose the top surface of dielectric layers 108 and form opening 124. In one implementation, a plasma etch may be performed to remove the layer in the openings 122. Once the airgap patterns/regions 124 have been etched, the photoresist layer 120 is removed or stripped off.

Figure 5:
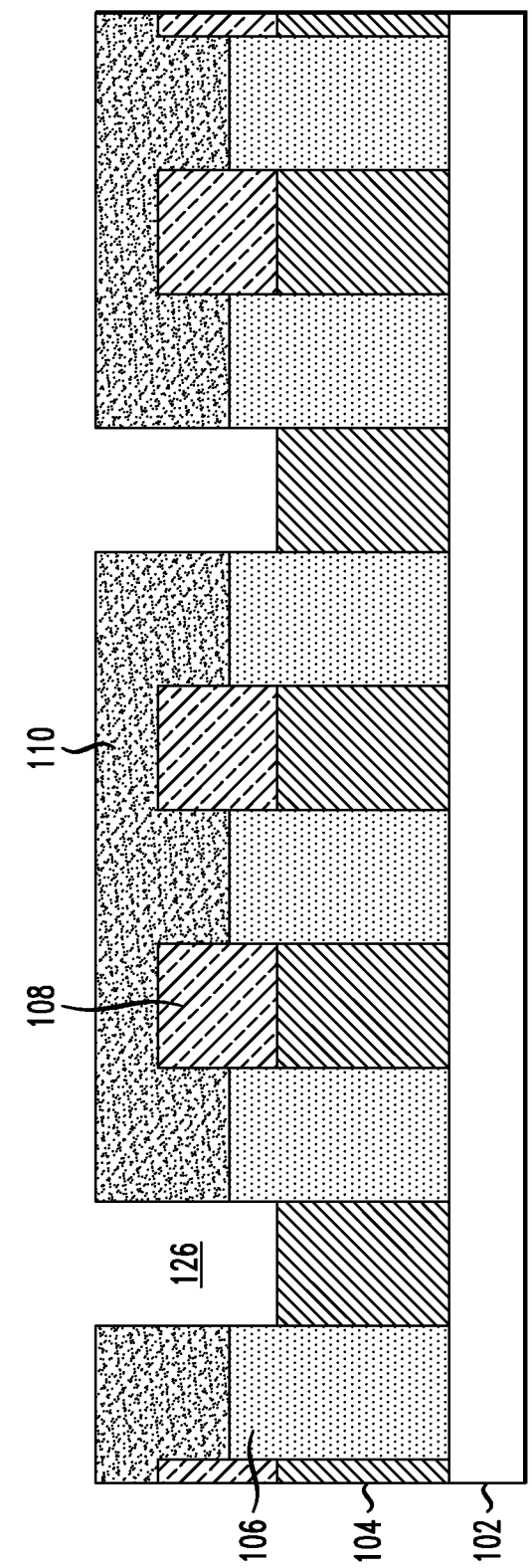
FIG. 5 is a cross-sectional view of a semiconductor device showing an interconnect structure with a selective ILD etch, in accordance with one illustrative embodiment.

Referring to FIG. 5, ILD layers 108 are selectively removed from openings 124 and form opening 126. The ILD layers 108 are selectively removed by, for example, an isotropic etch using an etchant that is selective to ILD layers 108 and not dielectric fill layer 110. For example, the isotropic etch may be a wet or dry etch that is selective to the ILD layers 108 in openings 124.

Figure 6:
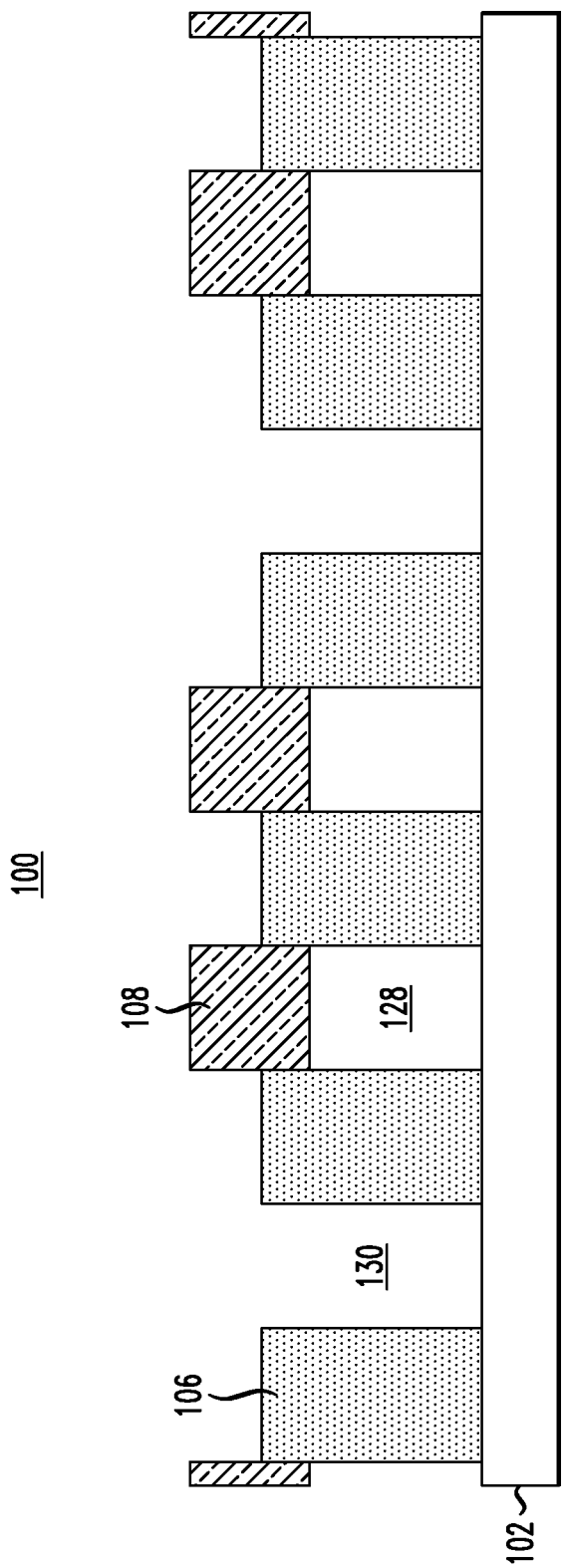
FIG. 6 is a cross-sectional view of a semiconductor device showing an interconnect structure with a dielectric extraction, in accordance with one illustrative embodiment.

Referring to FIG. 6, a dielectric extraction is carried out in the semiconductor structure 100 according to an embodiment. The dielectric layers 104 are removed, thereby creating airgaps 128 only in specific regions and openings 130. The airgaps 128 are controllably created according to the removal of the vertical dielectric spacers 104 under ILD layers 108 using an etchant that is selective to remove the vertical dielectric spacer 104 but not the ILD layers 108. In one embodiment, a dilute hydrofluoric acid (DHF) solution may be used, and the vertical dielectric spacers 104 are selected to have very high etch rates in DHF, while the ILD layers 108 are relatively resistant to etching in DHF.

Figure 7:
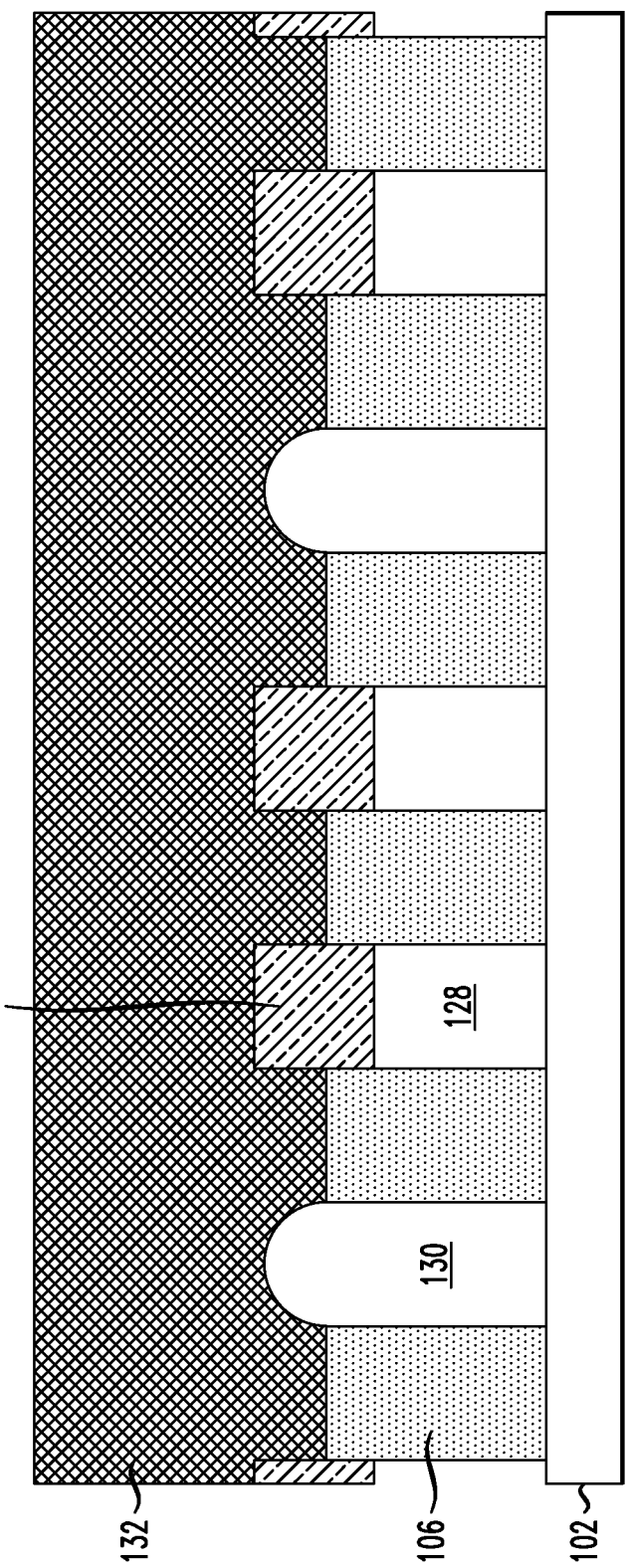
FIG. 7 is a cross-sectional view of a semiconductor device showing an interconnect structure with a Mx+1 selective ILD deposition, in accordance with one illustrative embodiment.

Referring to FIG. 7, a Mx+1 ILD layer 132 is deposited on the top surfaces of vertical metallic lines 106 and ILD layers 108 and over openings 130. The ILD layer 132 can be formed using any suitable dielectric material including, but not limited to, silicon oxide (e.g. $SiO_2$), SiN (e.g., (Si3N4), hydrogenated silicon carbon oxide (SiCOH), silicon-based low-k dielectrics, porous dielectrics, or other known ULK (ultra-low-k) dielectric materials. The ILD layer 132 can be deposited using known deposition techniques, such as, for example, ALD, CVD, PECVD or PVD.

Figure 8:
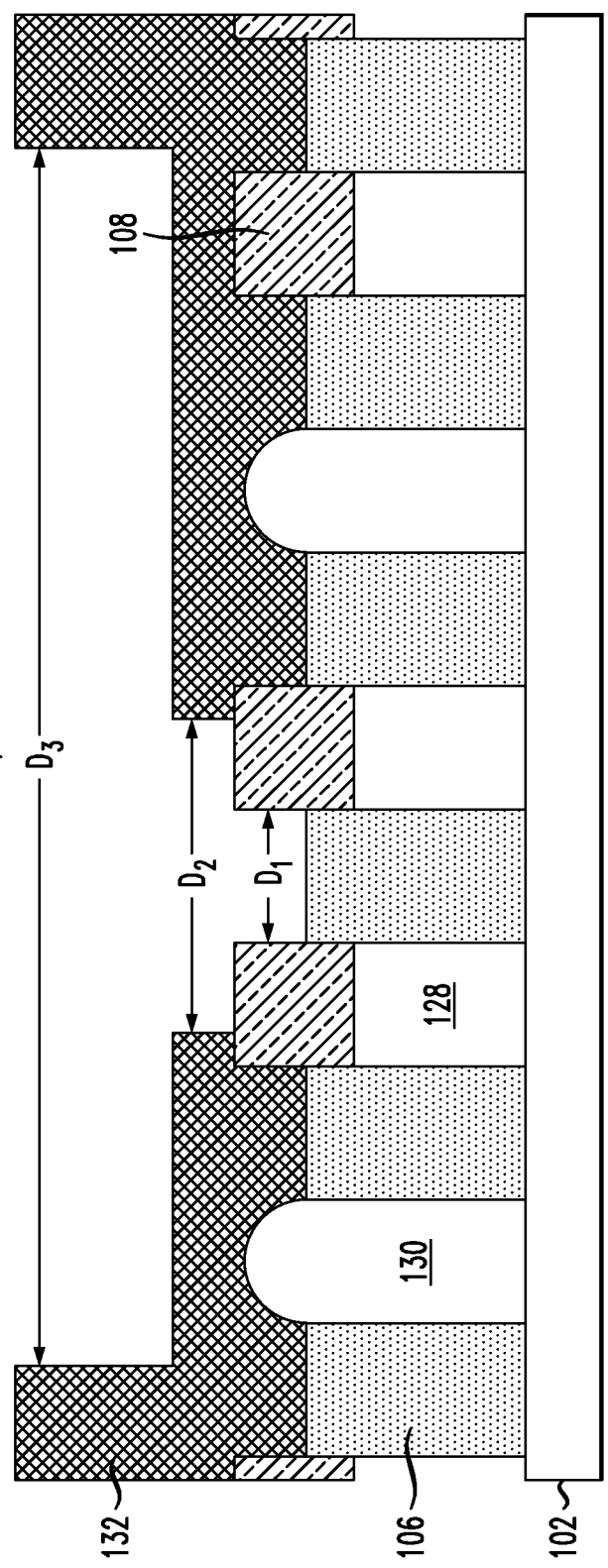
FIG. 8 is a cross-sectional view of a semiconductor device showing an interconnect structure with a Mx+1 etch, in accordance with one illustrative embodiment.

Referring to FIG. 8, ILD layer 132 is then etched by any conventional technique to form via 134. In the etching of ILD layer 132, via 134 can have a first opening defined by a distance $D_1$ in the x-axis of via 134, a second opening defined by distance $D_2$ in the x-axis that is larger than the distance $D_1$, and a third opening defined by distance $D_3$ in the x-axis that is larger than the distances $D_1$ and $D_2$. Via 134 can be formed by a directional etching such as RIE.

Figure 9:
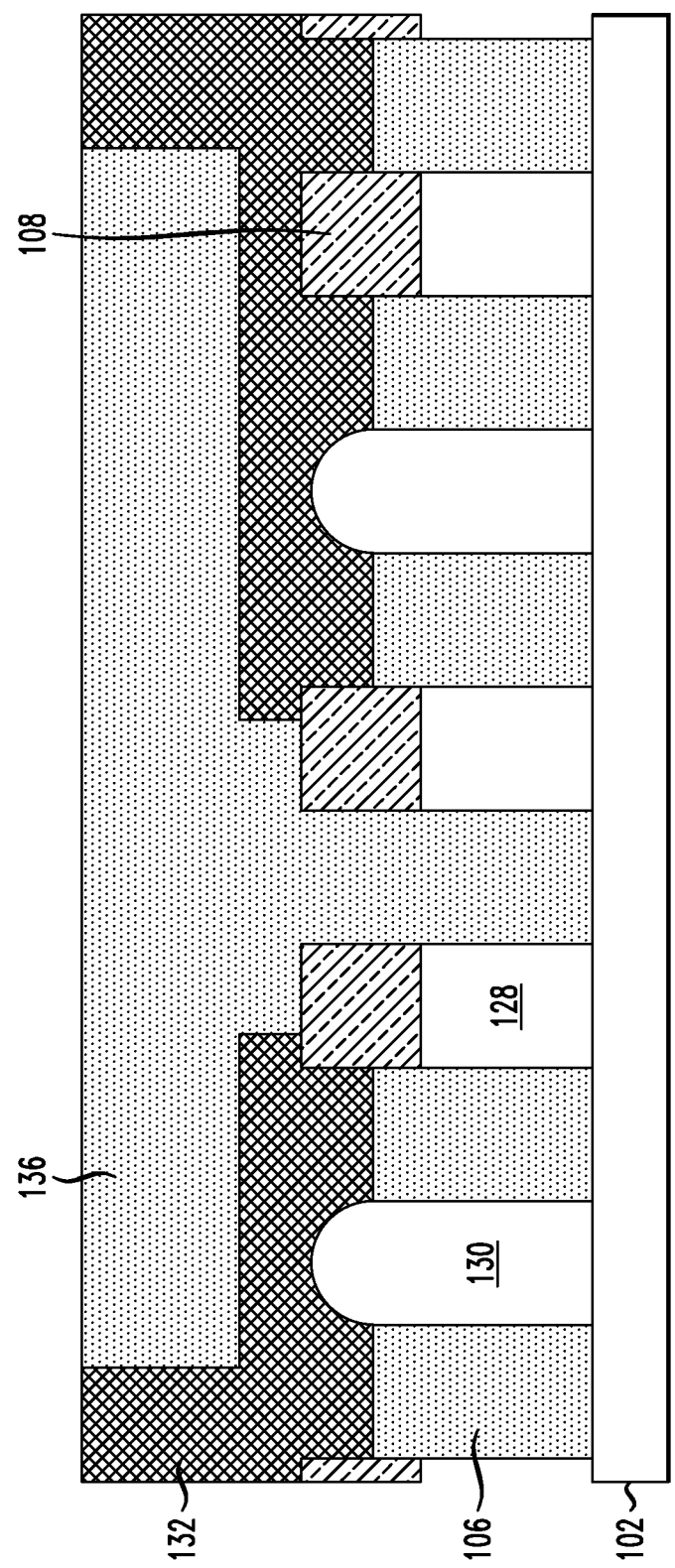
FIG. 9 is a cross-sectional view of a semiconductor device showing an interconnect structure with a Mx+1 metal fill, in accordance with one illustrative embodiment.
Figure 10:
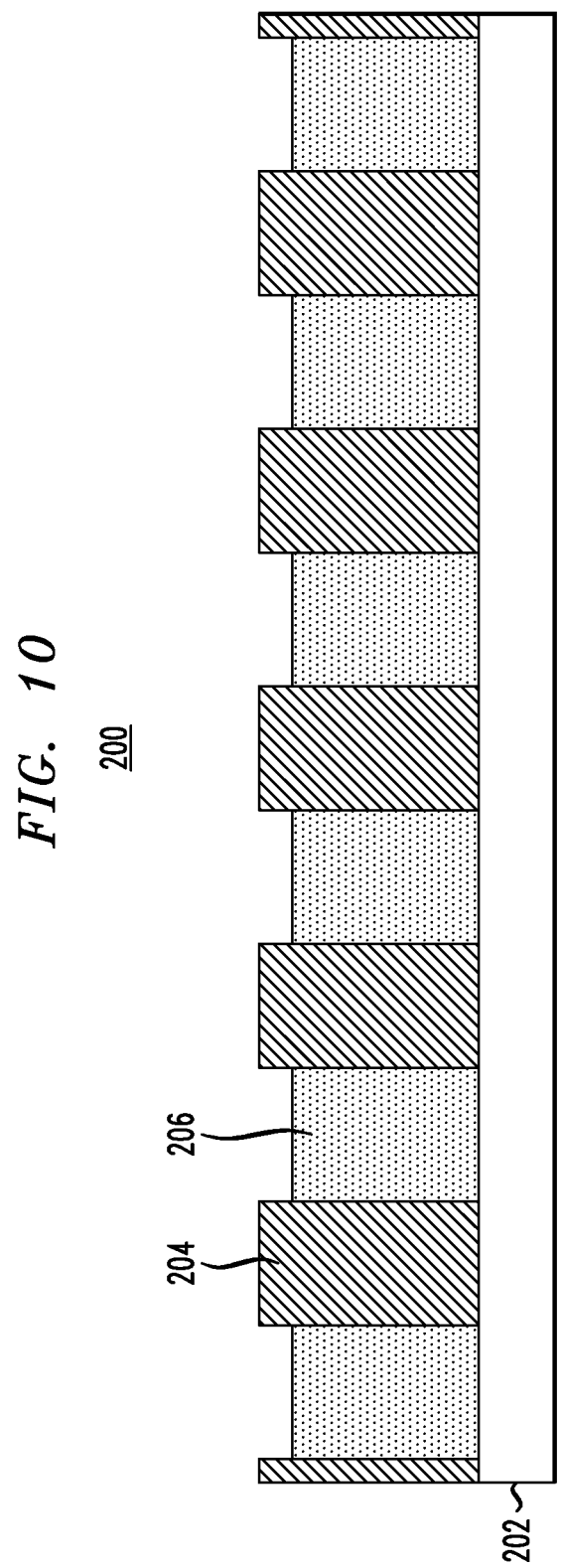
FIG. 10 is a cross-sectional view of a semiconductor device showing an interconnect structure with a recessed metal on a substrate, in accordance with a second illustrative embodiment.

Referring to FIG. 9, via 134 is filled with a metallic material 136 to form a second ILD level which includes metal level Mx+1. Suitable metallic material 136 includes, for example, aluminum (Al), tungsten (W), copper (Cu) or cobalt (Co). In one embodiment. metallic material 136 is the same as metallic material 106. In one embodiment. metallic material 136 is different than metallic material 106. The metallic material 136 can be conformally deposited using known methods such as ALD, CVD, PVD, electroplating, or electroless plating. A CMP process can then be performed to remove the overburden of the metallic material used to fill the opening, and to planarize the structure surface prior to any subsequent steps.

Another illustrative embodiment for forming a semiconductor device will now be described below with reference to FIGS. 10-19. Referring now to FIGS. 10-19 in which like numerals represent the same or similar elements and initially to FIG. 10, a cross-sectional view of a semiconductor structure 200 is illustratively shown for an interconnection level in accordance with the present principles. A substrate 202 may represent a previous metallization layer or may represent a substrate having semiconductor components (e.g., transistor, etc.) formed therein. The substrate 202 may include any structure where repeating metallization structures are to be connected. For example, as one skilled in the art will understand, the substrate 202 may be a metal layer that is part of an ILD level referred to as a first ILD level and its metal level may be referred to as Mx (x=1, 2, 3, etc.). The immediate ILD level overlying the metal level Mx may be referred to as a second ILD level which includes metal level Mx+1 and the next overlying ILD level may be referred to as a third ILD level having metal level Mx+2, etc.

A vertical dielectric spacer 204 is formed on the substrate 202. The vertical dielectric spacer 204 may include any suitable dielectric material as discussed above for vertical dielectric spacers 104. The dielectric layer 204 may be formed by, for example, a spin-on process, CVD or any other suitable process. A PECVD may be employed for depositing silicon dioxide ($SiO_2$), fluorine-doped oxides (F—$SiO_2$), carbon-doped oxides (SiCOH) and porous carbon-doped oxides (p-SiCOH). PECVD materials including additional porosity (p-SiCOH) may be employed for back end of the line (BEOL) applications.

After the formation of the vertical dielectric spacer 204, a lithography, etching and deposition process can be performed to pattern the dielectric layer 204 to form openings to deposit conductive materials. The conductive materials are deposited in the openings, and a planarization process, such as, e.g., a CMP may be performed to form vertical metallic lines 206. The vertical metallic lines 206 may include any material as discussed above for vertical metallic lines 106.

Following planarization of semiconductor structure 200, vertical metallic lines 206 are selectively recessed using techniques known in the art. For example, vertical metallic lines 206 can be selectively recessed using directional removal techniques such as, for example, RIE and/or a wet etch process.

Figure 11:
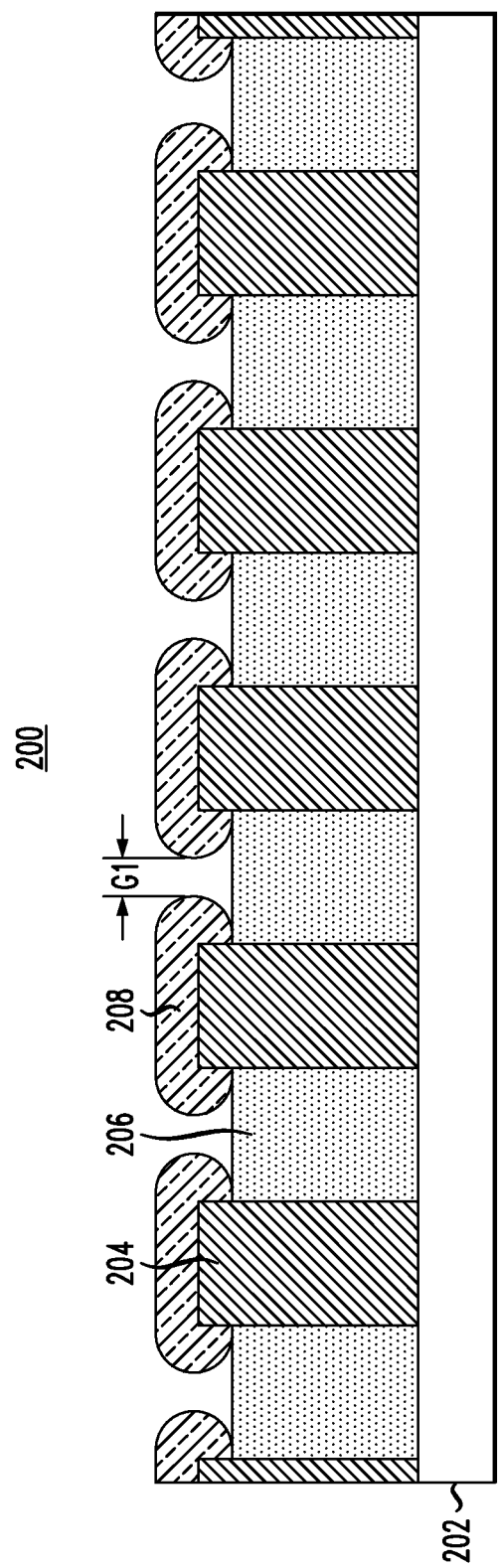
FIG. 11 is a cross-sectional view of a semiconductor device showing an interconnect structure with a selective ILD cap deposition, in accordance with a second illustrative embodiment.

Referring to FIG. 11, a selective ILD cap deposition is carried out on semiconductor structure 200. Selective ILD deposition methods may commonly include, but are not limited to, liquid phase deposition, ALD, and CVD methods. Suitable ILD cap material include, for example, silicon oxide, silicon nitride, silicon oxinitride, refractory metal silicon nitride with the refractory metal being Ta, Zr, Hf or W, silicon carbide, silicon carbo-oxide, and their hydrogenated compounds. The ILD cap layers 208 are selectively deposited over vertical dielectric spacers 204 and into a portion of vertical metallic lines 206 thereby leaving a gap defined by a distance G1 in the x-axis between adjacent ILD cap layers 208.

Figure 12:
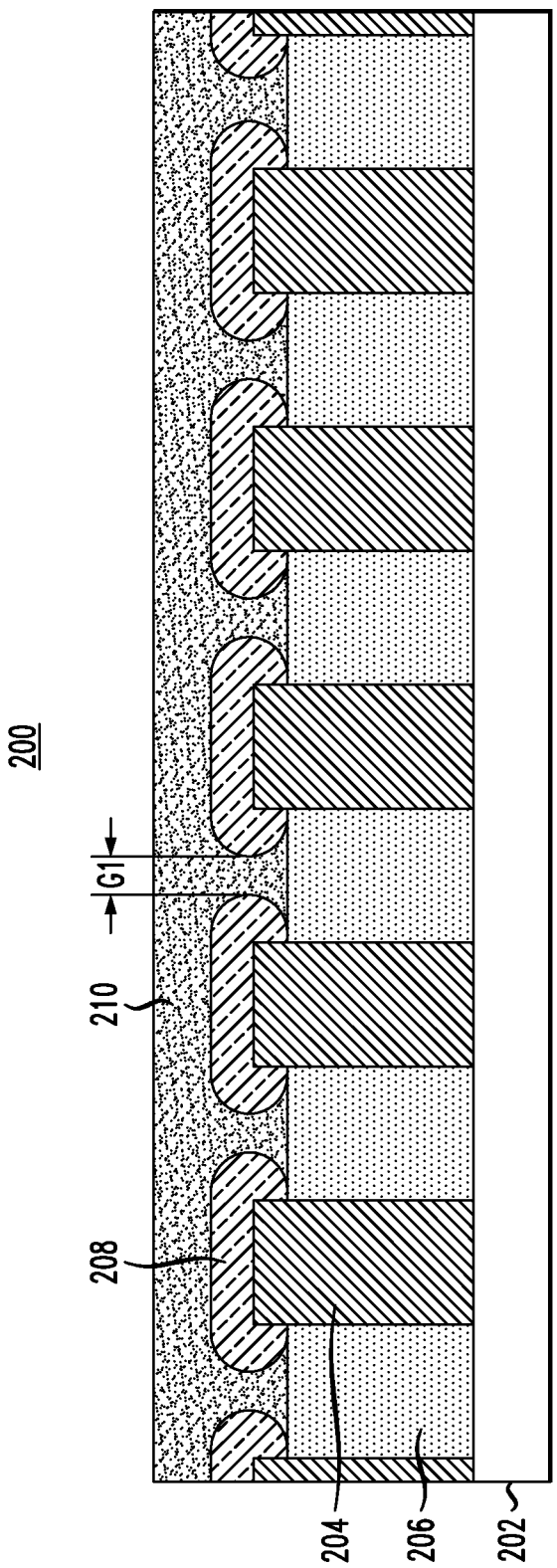
FIG. 12 is a cross-sectional view of a semiconductor device showing an interconnect structure with conformal cap deposition, in accordance with a second illustrative embodiment.

Referring to FIG. 12, following the selective ILD cap deposition, a dielectric fill layer 210 is deposited on vertical metallic lines 206 and ILD cap layers 208 and filling the gap defined by distance G1 in vertical metallic lines 206. The dielectric fill layer 210 can be any of the dielectric material discussed above for dielectric fill layer 110. According to an embodiment of the present invention, the dielectric fill layer 210 is deposited using, for example, deposition techniques including, but not limited to, CVD, PECVD, RFCVD, PVD, and ALD, followed by a planarization process, such as, for example, CMP.

Figure 13:
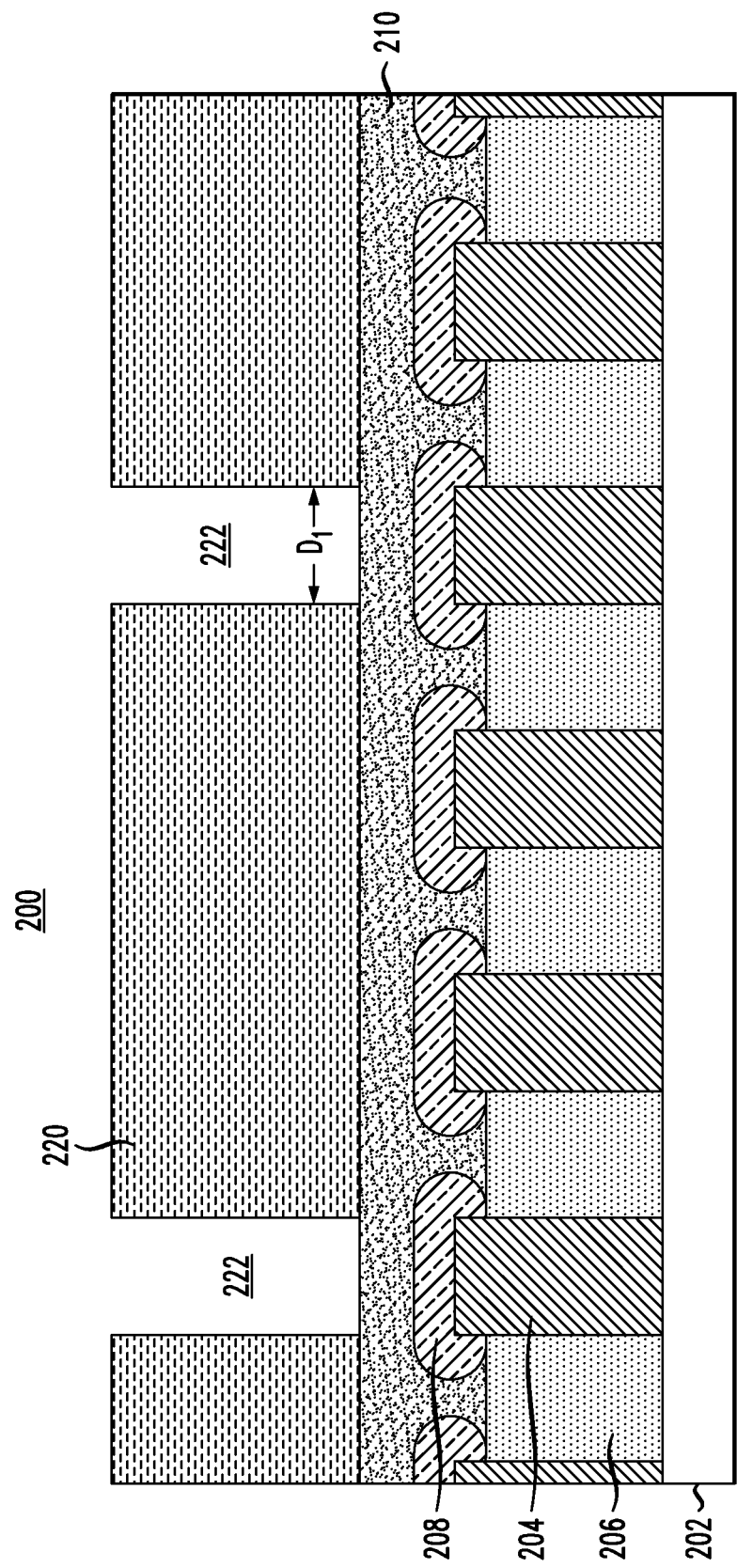
FIG. 13 is a cross-sectional view of a semiconductor device showing an interconnect structure following an airgap etch, in accordance with a second illustrative embodiment.

Referring to FIG. 13, a photoresist layer 220 is disposed on top of dielectric fill layer 210 to cover the semiconductor structure 200. The photoresist layer 220 is patterned/etched to create openings 222. The openings 222 may have a distance $D_1$ (e.g., a diameter or width in the x-axis) that is etched into the photoresist layer 222. In one implementation, the distance $D_1$ is a distance equal to the distance of vertical metallic lines 206.

Figure 14:
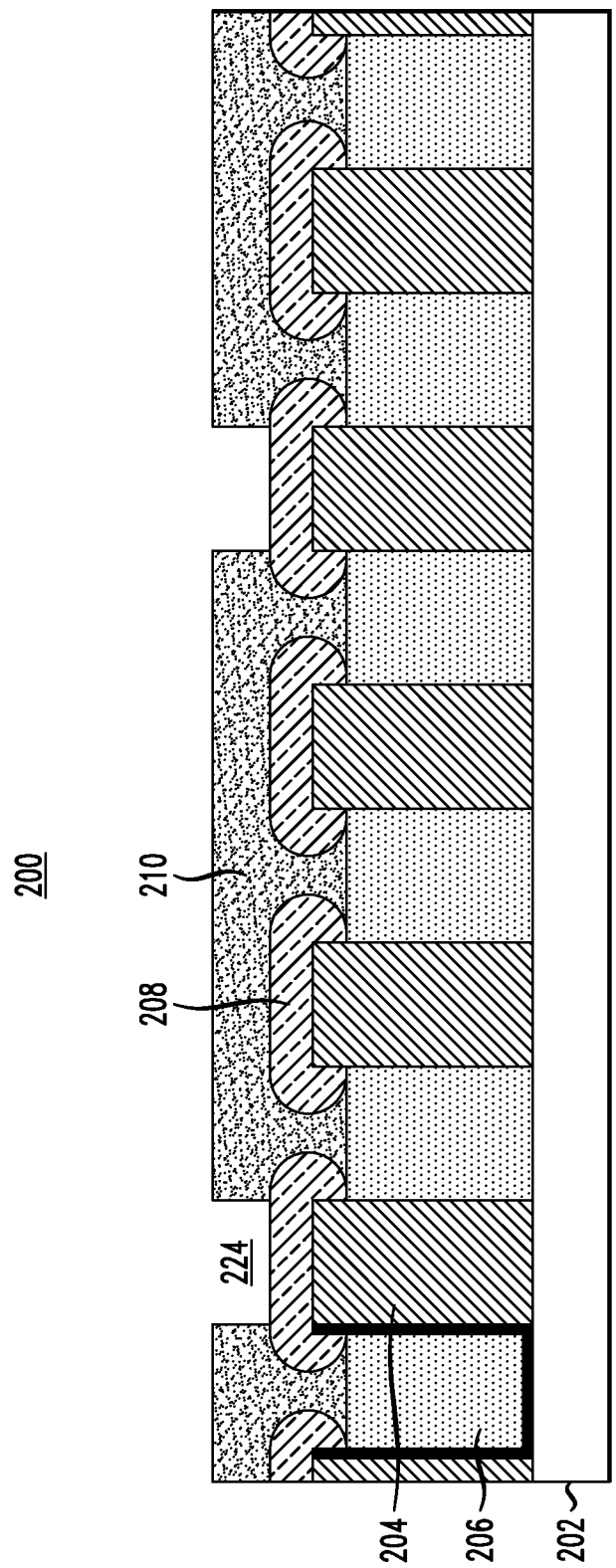
FIG. 14 is a cross-sectional view of a semiconductor device showing an interconnect structure with an airgap resist strip, in accordance with a second illustrative embodiment.

Referring to FIG. 14, an airgap patterning etch is then performed on semiconductor structure 200 according to an embodiment. First, etching is performed to extend openings 222 in the photoresist layer 220 as the pattern location (in FIG. 13). In the openings 222, the etching removes the dielectric fill layer 210 to expose the top surface of ILD cap layers 208 and form opening 224. In one embodiment, a plasma etch may be performed to remove the layer in the openings 222. Once the airgap patterns/regions 224 have been etched, the photoresist layer 220 is removed or stripped off.

Figure 15:
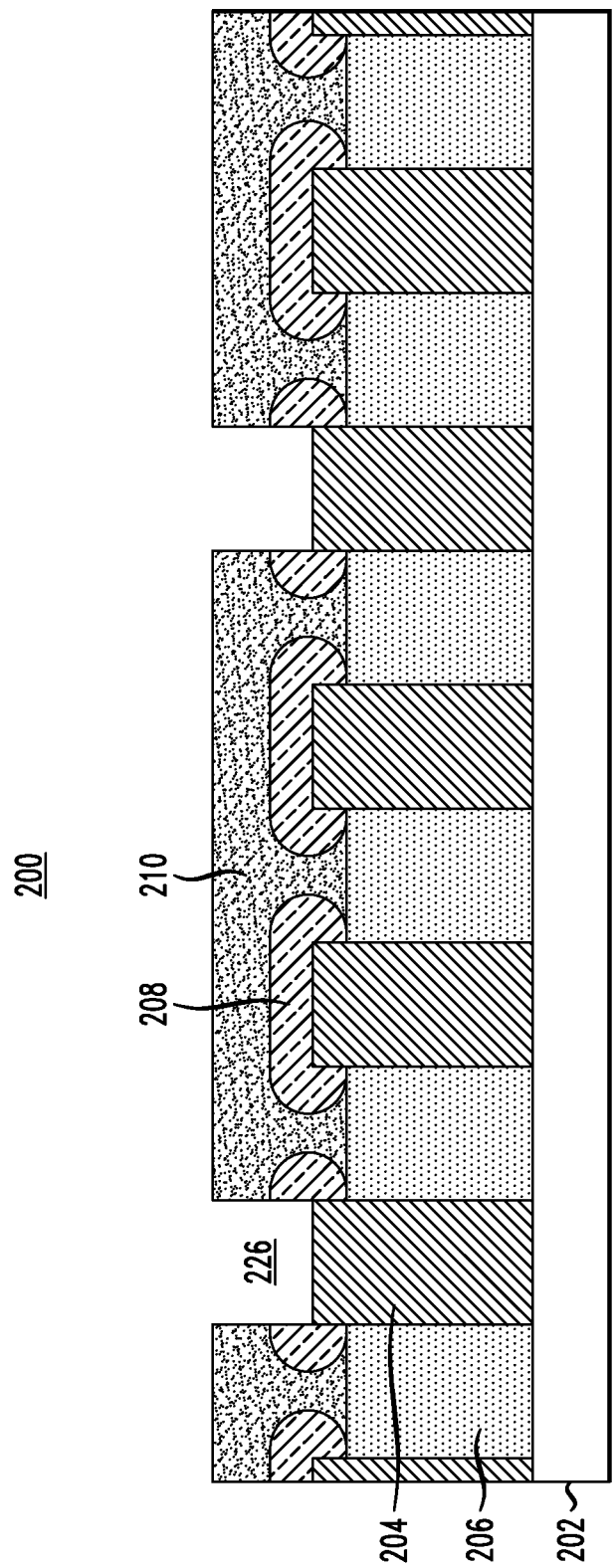
FIG. 15 is a cross-sectional view of a semiconductor device showing an interconnect structure with a selective ILD etch, in accordance with a second illustrative embodiment.

Referring to FIG. 15, ILD cap layers 208 are selectively removed from openings 224 and form openings 226. The ILD layers 208 are selectively removed by, for example, an isotropic etch, using an etchant that is selective to ILD layers 208 and not dielectric fill layer 210. For example, the isotropic etch may be a wet or dry etch that is selective to the ILD layers 208 in openings 224.

Figure 16:
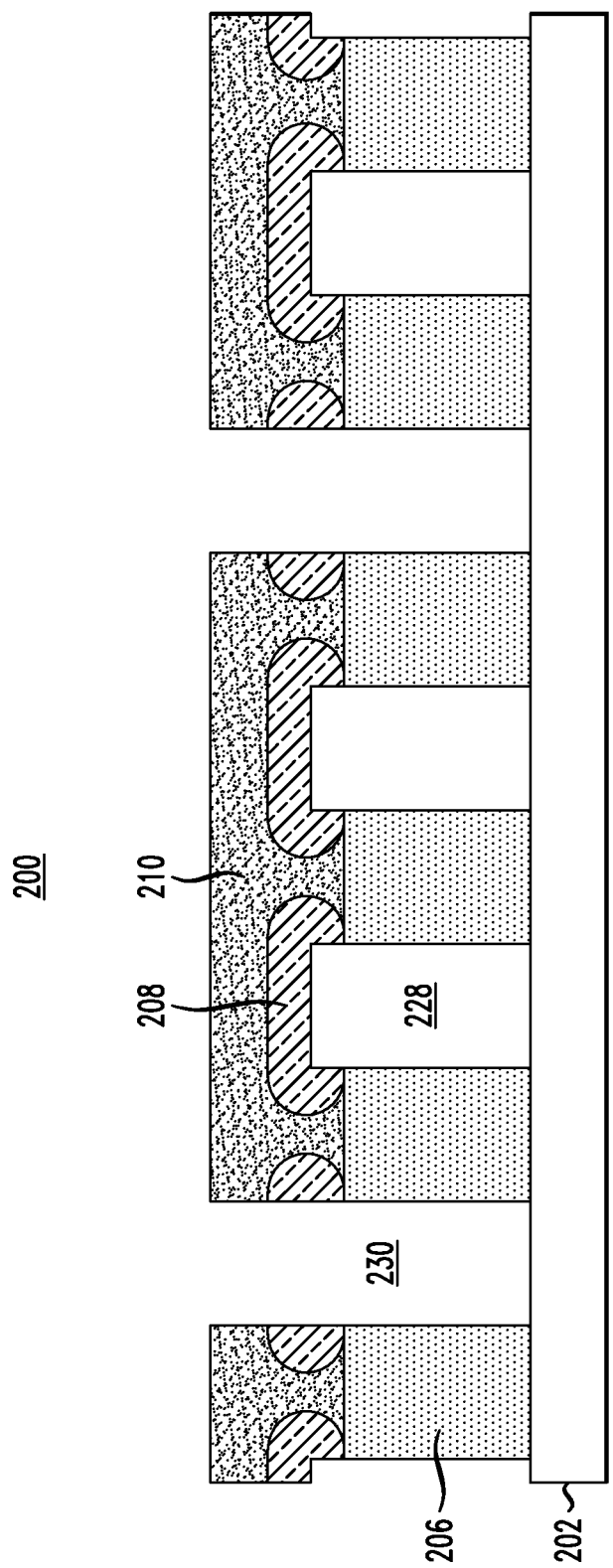
FIG. 16 is a cross-sectional view of a semiconductor device showing an interconnect structure with a dielectric extraction, in accordance with a second illustrative embodiment.

Referring to FIG. 16, a dielectric extraction is carried out in the semiconductor structure 200 according to an embodiment. The dielectric spacers 204 are removed, thereby creating airgaps 228 only in specific regions as well as openings 230. The airgaps 228 are controllably created according to the removal of the vertical dielectric spacers 204 under ILD layers 208 using an etchant that is selective to remove the vertical dielectric spacers 204 but not the ILD layers 208. In one embodiment, a dilute hydrofluoric acid (DHF) solution may be used, and the vertical dielectric spacers 204 are selected to have very high etch rates in DHF, while the ILD layers 208 are relatively resistant to etching in DHF.

Figure 17:
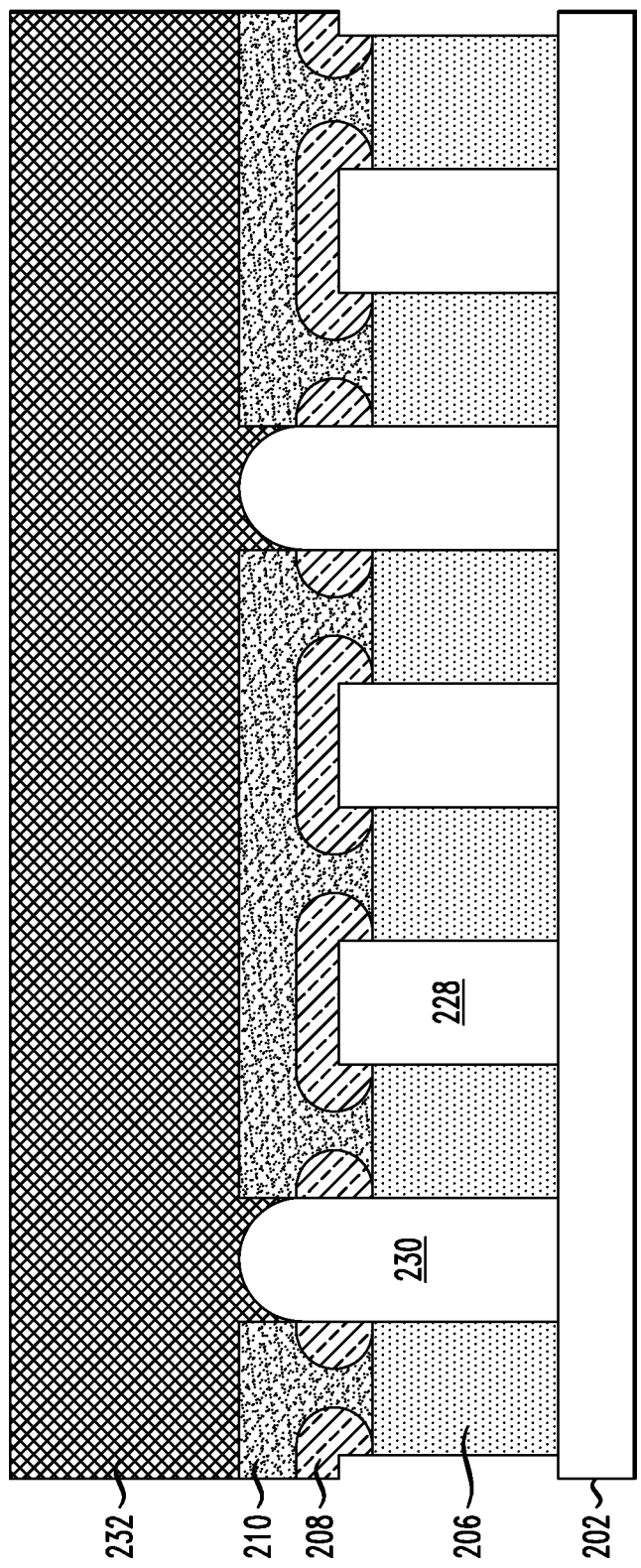
FIG. 17 is a cross-sectional view of a semiconductor device showing an interconnect structure with a Mx+1 selective ILD deposition, in accordance with a second illustrative embodiment.
Figure 18:
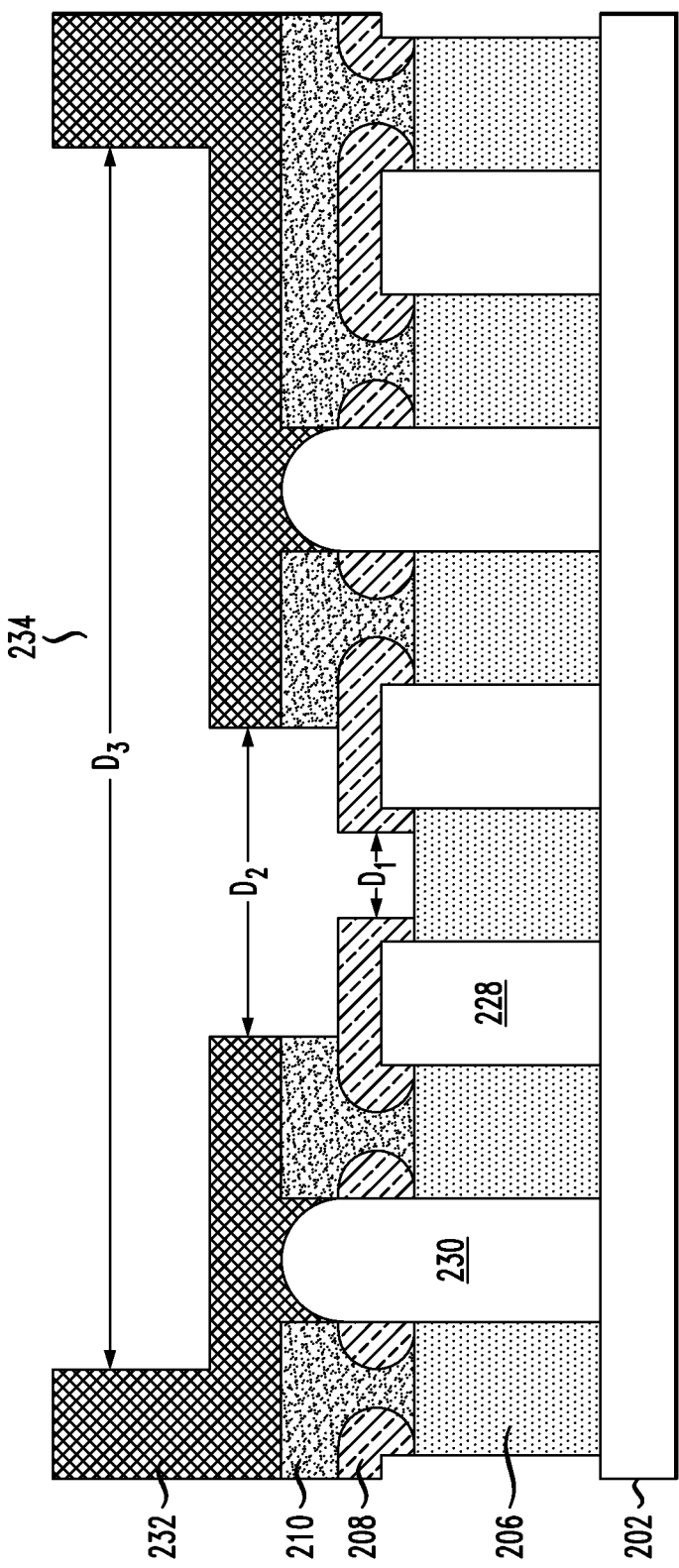
FIG. 18 is a cross-sectional view of a semiconductor device showing an interconnect structure with a Mx+1 etch, in accordance with a second illustrative embodiment.

Referring to FIG. 17, a Mx+1 ILD layer 232 is deposited on the top surfaces of dielectric fill layer 210 and over openings 230. The ILD layer 232 can be formed using any suitable dielectric material including, but not limited to, silicon oxide (e.g. $SiO_2$), SiN (e.g., ($Si3N4$), hydrogenated silicon carbon oxide (SiCOH), silicon-based low-k dielectrics, porous dielectrics, or other known ULK (ultra-low-k) dielectric materials. The ILD layer 232 can be deposited using known deposition techniques, such as, for example, ALD, CVD, PECVD, PVD and spin coating Referring to FIG. 18, ILD layer 232 is then etched by any conventional technique to form via 234. In the etching of ILD layer 232, via 234 can have a first opening defined by a distance $D_1$ in the x-axis of via 234, a second opening defined by distance $D_2$ in the x-axis that is larger than the distance $D_1$, and a third opening defined by distance $D_3$ in the x-axis that is larger than the distances $D_1$ and $D_2$. Via 234 can be formed by a directional etching such as RIE.

Figure 19:
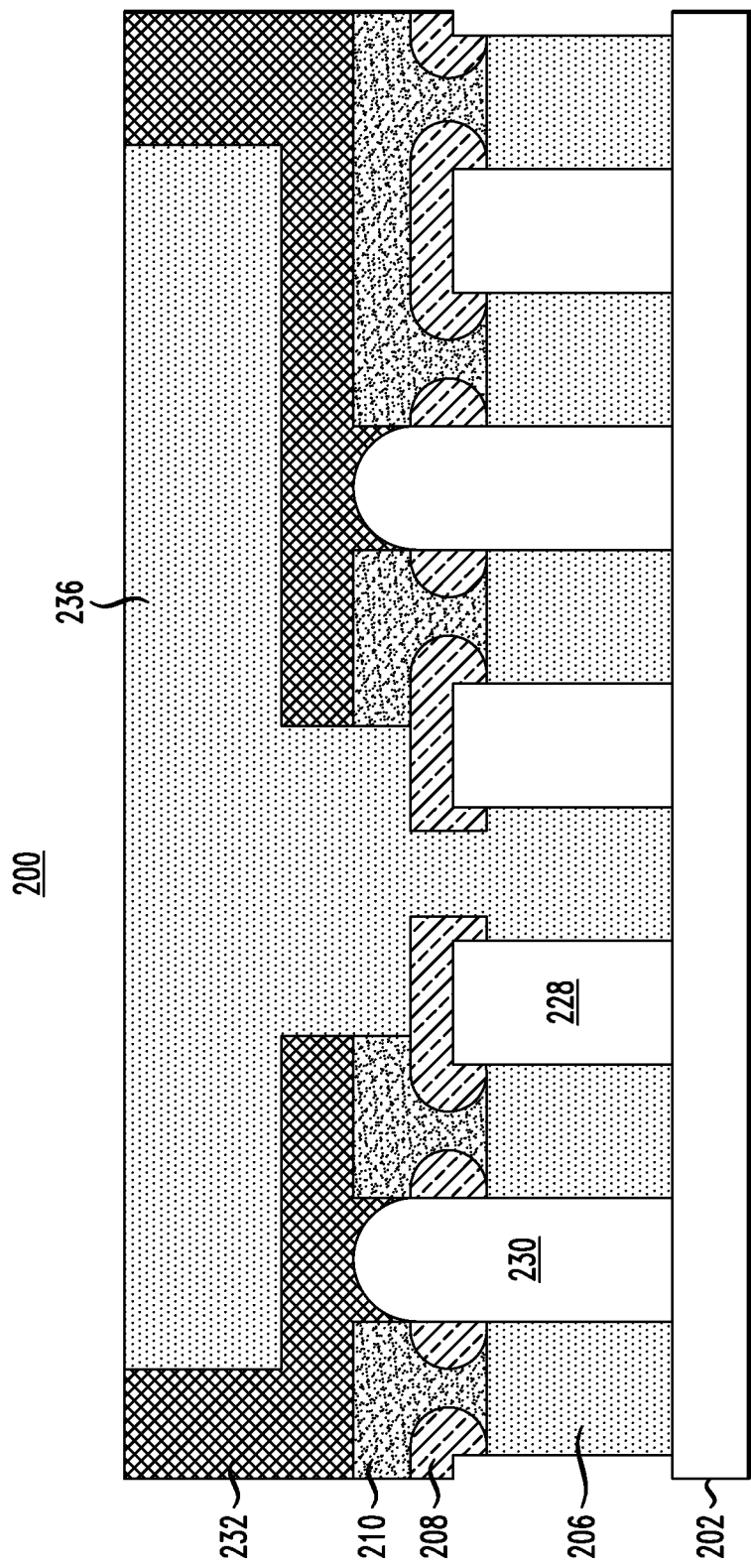
FIG. 19 is a cross-sectional view of a semiconductor device showing an interconnect structure with a Mx+1 metal fill, in accordance with a second illustrative embodiment.

Referring to FIG. 19, via 234 is filled with a metallic material 236 to form a second ILD level which includes metal level Mx+1. Suitable metallic material 236 includes, for example, Al, W, Cu or Co. The metallic material 236 can be conformally deposited using known methods such as ALD, CVD, PVD, electroplating, or electroless plating. A CMP process can then be performed to remove the overburden of the metallic material used to fill the opening, and to planarize the structure surface prior to any subsequent steps.

It is to be further understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for forming a semiconductor device, the method comprising:
   forming an alternating arrangement of vertical metallic lines and vertical dielectric spacers on a substrate;
   recessing the vertical dielectric spacers below a top surface of the vertical metallic lines;
   selectively depositing an interlevel dielectric layer on the recessed vertical dielectric spacers and above the top surface of the vertical metallic lines;
   depositing a dielectric fill on the interlevel dielectric layer and over the top surface of the vertical metallic lines;
   patterning a photoresist on the dielectric fill to form a plurality of openings in the photoresist, wherein a first opening of the photoresist is in vertical alignment with a first vertical dielectric spacer and a second opening of the photoresist is in vertical alignment with a second vertical dielectric spacer, and further wherein at least a third vertical dielectric spacer and a fourth vertical dielectric spacer are disposed between the first vertical dielectric spacer and the second vertical dielectric spacer;

selectively etching the dielectric fill and the interlevel dielectric layer in the first opening and the second opening to expose a top surface of the respective first vertical dielectric spacer and the second vertical dielectric spacer;

removing the photoresist and the dielectric fill; and removing the vertical dielectric spacers to expose the top surfaces of the substrate in the first opening and the second opening and the vertical metallic lines, and wherein the interlevel dielectric layer seals an air gap between a top surface of the substrate and a bottom surface of the interlevel dielectric layer in place of third vertical dielectric spacer and the fourth vertical dielectric spacer.

2. The method of claim 1, wherein the substrate comprises a first Mx level.

3. The method of claim 1, wherein the dielectric fill comprises silicon dioxide, flowable oxide, or spin-on-glass.

4. The method of claim 1, wherein the vertical dielectric spacers comprise a low-k material.

5. The method of claim 2, further comprising forming a second metal level on the substrate.

6. The method of claim 1, further comprising depositing another interlevel dielectric layer on the top surfaces of the vertical metallic lines and the interlevel dielectric layer and over the first opening and the second opening.

7. The method of claim 6, further comprising etching a via in the second interlevel dielectric layer to expose a top surface of the vertical metallic line disposed between the airgaps.

8. The method of claim 7, further comprising depositing a metallic material in the via.

9. The method of claim 8, wherein the metallic material is the same metallic material as the vertical metallic lines.

10. A method for forming a semiconductor device, the method comprising:

forming an alternating arrangement of vertical metallic lines and vertical dielectric spacers on a substrate;

recessing the vertical metallic lines below a top surface of the vertical dielectric spacers;

selectively depositing an interlevel dielectric layer on the vertical dielectric spacers and on sidewalls in the recessed vertical metallic lines leaving an opening therebetween and exposing a top surface of the recessed vertical metallic lines;

depositing a dielectric fill on the interlevel dielectric layer and in the openings;

patterning a photoresist on the dielectric fill to form a plurality of openings in the photoresist, wherein a first opening of the photoresist is in vertical alignment with a first vertical dielectric spacer and a second opening of the photoresist is in vertical alignment with a second vertical dielectric spacer, and further wherein at least a third vertical dielectric spacer and a fourth vertical dielectric spacer are disposed between the first vertical dielectric spacer and the second vertical dielectric spacer;

selectively etching the dielectric fill and the interlevel dielectric layer in the first opening and the second opening to expose a top surface of the first vertical dielectric spacer and the second vertical dielectric spacer;

removing the photoresist; and removing the vertical dielectric spacers to expose the top surfaces of the substrate in the first opening and the second opening and the vertical metallic lines, and wherein the first interlevel dielectric layer seals an air gap between a top surface of the substrate and a bottom surface of the interlevel dielectric layer in place of third vertical dielectric spacer and the fourth vertical dielectric spacer.

11. The method of claim 10, wherein the substrate comprises a first Mx level.

12. The method of claim 10, wherein the dielectric fill comprises silicon dioxide, flowable oxide, or spin-on-glass.

13. The method of claim 10, wherein the vertical dielectric spacers comprise a low-k material.

14. The method of claim 10, further comprising forming a second metal level on the substrate.

15. The method of claim 10, further comprising depositing another interlevel dielectric layer on the top surfaces of the vertical metallic lines and the interlevel dielectric layer and over the first opening and the second opening.

16. The method of claim 15, further comprising etching a via in the another interlevel dielectric layer to expose a top surface of the vertical metallic line disposed between the airgaps.

17. The method of claim 16, further comprising depositing a metallic material in the via.

* * * * *